(12) United States Patent
Lei et al.

(10) Patent No.: US 10,276,450 B2
(45) Date of Patent: Apr. 30, 2019

(54) FABRICATION TECHNOLOGY FOR METAL GATE

(71) Applicant: Shanghai Huali Microelectronics Corporation, Shanghai (CN)

(72) Inventors: Tong Lei, Shanghai (CN); Yongyue Chen, Shanghai (CN); Haifeng Zhou, Shanghai (CN)

(73) Assignee: Shanghai Huali Microelectronics Corporation, Shanghai (CN)

(*) Notice: Subject to any disclaimer, the term of this patent is extended or adjusted under 35 U.S.C. 154(b) by 0 days.

(21) Appl. No.: 15/429,195

(22) Filed: Feb. 10, 2017

(65) Prior Publication Data

US 2018/0174924 A1    Jun. 21, 2018

(30) Foreign Application Priority Data

Dec. 16, 2016  (CN) .......................... 2016 1 1169046

(51) Int. Cl.
| | |
|---|---|
| H01L 21/033 | (2006.01) |
| H01L 21/8238 | (2006.01) |
| H01L 27/092 | (2006.01) |
| H01L 29/66 | (2006.01) |
| H01L 21/02 | (2006.01) |
| H01L 21/321 | (2006.01) |

(52) U.S. Cl.
CPC .............. H01L 21/823828 (2013.01); H01L 21/02115 (2013.01); H01L 21/02167 (2013.01); H01L 21/0332 (2013.01); H01L 21/3212 (2013.01); H01L 27/0922 (2013.01); H01L 29/66545 (2013.01)

(58) Field of Classification Search
CPC .......... H01L 21/475; H01L 21/469–21/47576; H01L 21/823828; H01L 21/0332
See application file for complete search history.

(56) References Cited

U.S. PATENT DOCUMENTS

| | | | | |
|---|---|---|---|---|
| 5,417,803 | A * | 5/1995 | Goldstein | C04B 41/459 216/2 |
| 6,776,917 | B2 * | 8/2004 | Hsiao | B24B 37/013 216/88 |
| 8,191,237 | B1 * | 6/2012 | Luo | G11B 5/1278 29/603.13 |
| 2014/0357077 | A1 * | 12/2014 | Lee | H01L 21/76898 438/667 |

* cited by examiner

*Primary Examiner* — Julio J Maldonado
*Assistant Examiner* — Evan Clinton
(74) *Attorney, Agent, or Firm* — Kilpatrick Townsend & Stockton, LLP (57) ABSTRACT

One aspect of the present disclosure is a method of fabricating metal gate by forming special layers in place of traditional TiN hard mask over the ILD0 layer to avoid ILD0 losses due to conventional ILD0 CMP. The method can comprise: after the ILD0 CMP, forming a first thin ashable film layer over the ILD0 layer; then forming a second thin dielectric layer over the first layer; during the aluminum CMP process for a first region (PMOS or NMOS), removing the second layer through polishing until the top surface of the first ashable film layer; and then removing first ashable film layer through an ashing method such as burning. In this way, ILD0 loss can be reduced during the first aluminum CMP step and thus can reduce initial height of ILD0, which in turn can reduce the height of initial dummy gate filled in the cavity.

8 Claims, 11 Drawing Sheets

FIG. 1A

-- Prior Art --

FABRICATION TECHNOLOGY FOR METAL GATE

BACKGROUND OF THE INVENTION

The present invention is directed to semiconductor processes and devices.

Since the early days when Dr. Jack Kilby at Texus Instrument invented the integrated circuit, scientists and engineers have made numerous inventions and improvements on semiconductor devices and processes. The last five decades or so have seen a significant reduction in semiconductor sizes, which translate to ever increasing processing speed and decreasing power consumption. And so far, the development of semiconductor has generally followed Moore's Law, which roughly states that the number of transistors in a dense integrated circuit doubles approximately every two years. Now, semiconductor processes are pushing toward below 20 nm, where some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and pushing toward the boundary of what physically possible. Huali Microeletronic Corporation™ is one of the leading semiconductor fabrication companies that has focused on the research and development of semiconductor devices and processes.

When fabricating transistors with typical gate dimensions below 50 nm, the so-called "high-k/metal gate" (HKMG) technology has become popular. According to the HKMG manufacturing process flow, an insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices. Currently, two different approaches exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages such as dopant ion implantation, source and drain region formation and substrate silicidation are performed in the presence of a sacrificial dummy gate. The dummy gate is replaced by the real gate after the high-temperature source/drain formation and all silicide annealing cycles have been carried out.

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The present disclosure relates to fabrication of high-k/metal gate (HKMG) stacks for semiconductors, in particular to reducing diffusion of O2 into the IL after the HKMG stack is formed.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings), may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. Section 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

The use of aluminum or aluminum alloy for metal gate electrodes in a high-k gate structure has cost and performance advantages. The aluminum gate chemical mechanical polishing (CMP) process is a very important process for manufacturing high-k metal gate transistors with aluminum gates. In order to increase the gap filling space, a CMP process of aluminum gate structures typically includes two CMP steps: a CMP process for P-type aluminum gate transistors (PFET) and a CMP process for N-type aluminum gate transistors (NFET). In the CMP process for the PFET, the dummy poly is first removed in the PMOS region. During that step, the work function deposition of the PMOS region is then completed and the metal gate of the PMOS region is formed. After the metal gate of the PMOS region is formed, the dummy poly is removed in the NMOS region, and the work function deposition of the NMOS region is then completed and the metal gate of the NMOS region is formed. Although this two-step CMP process is relatively lengthy, it avoids selective etching of the work function metal deposition, which can be more difficult to control.

Figure 1A:
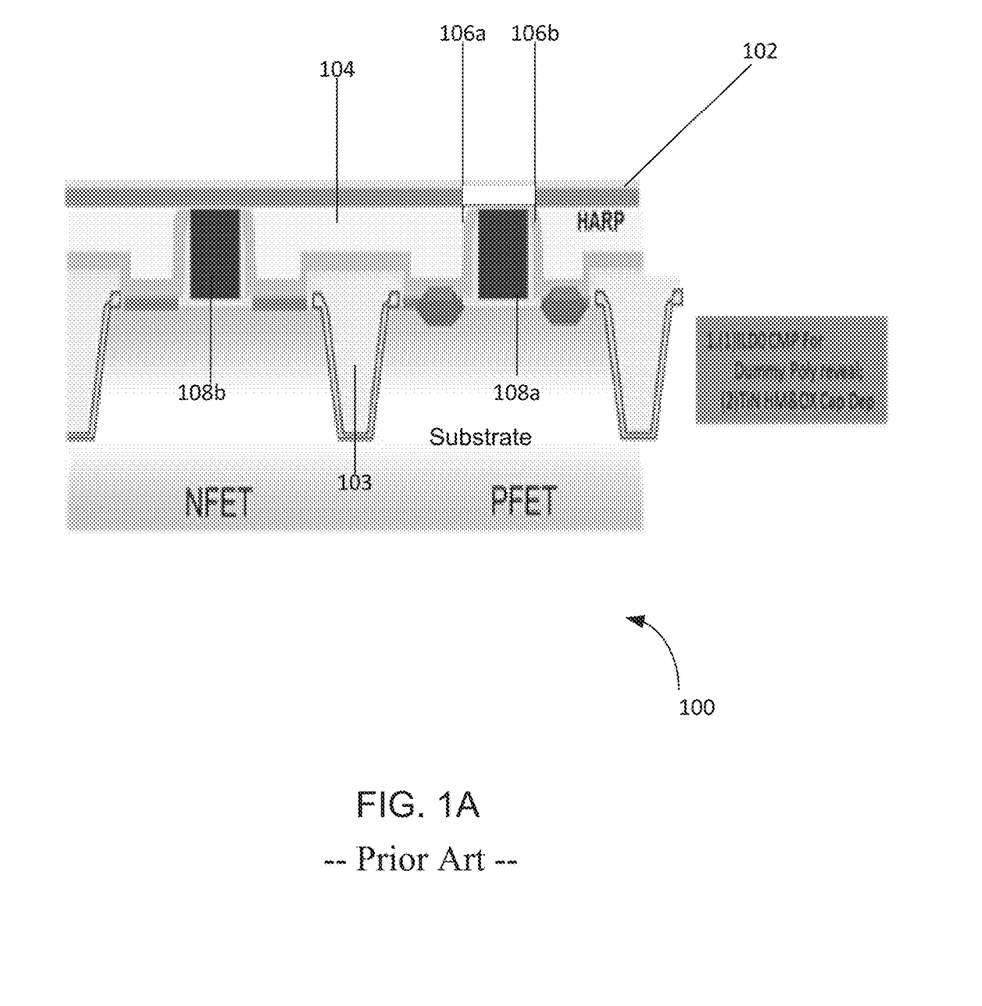
FIGS. 1A-F illustrate a process of a conventional two-step CMP process for manufacturing a semiconductor device.

FIGS. 1A-F illustrate a process of a conventional two-step CMP process for manufacturing a semiconductor device. FIG. 1A illustrates, through this process, a semiconductor device 100 can be provided over a substrate. As shown, spacers 106a-b can be provided over the substrate using a double sidewall spacer process. For illustrative purposes, the term sidewall spacers may be referred to as both the first sidewall spacer 106a and the second sidewall spacer 106b. In one embodiment, the sequential structure of the sidewall spacers 106 from inside to outside is the silicon oxide layer the first sidewall spacer 106 a—the silicon nitride layer of the first sidewalls spacer 106 a—the silicon oxide layer of the second sidewall spacers 106 b—the silicon nitride layer of the second sidewall spacer 106b. In other embodiments, the sidewall spacers 106 may be formed by a single sidewall spacer process, e.g., the sidewall spacer may be made of only one of silicon oxide and silicon nitride.

As also shown in FIG. 1A, an interlayer dielectric layer 104 may be formed on the substrate for example by a CVD process or a PVD process. The interlayer dielectric layer 104 may be referred to as a zero order interlayer dielectric layer, or ILD0. The interlayer dielectric layer 104 may be made of any appropriate isolation material, such as silicon oxide or silicon nitride, etc. As still shown, the semiconductor device 100 may comprise a first dummy gate 108a in a P-type metal gate transistor region (PFET), a second dummy gate 108b in an N-type metal gate transistor region (NFET). As also shown, a hard mark layer 102 may be formed over ILD0 104. The hard mask layer 102 may be formed after a CMP process on the ILD0 104 and comprises titanium nitride (TiN), and/or HMOX.

Figure 1B:
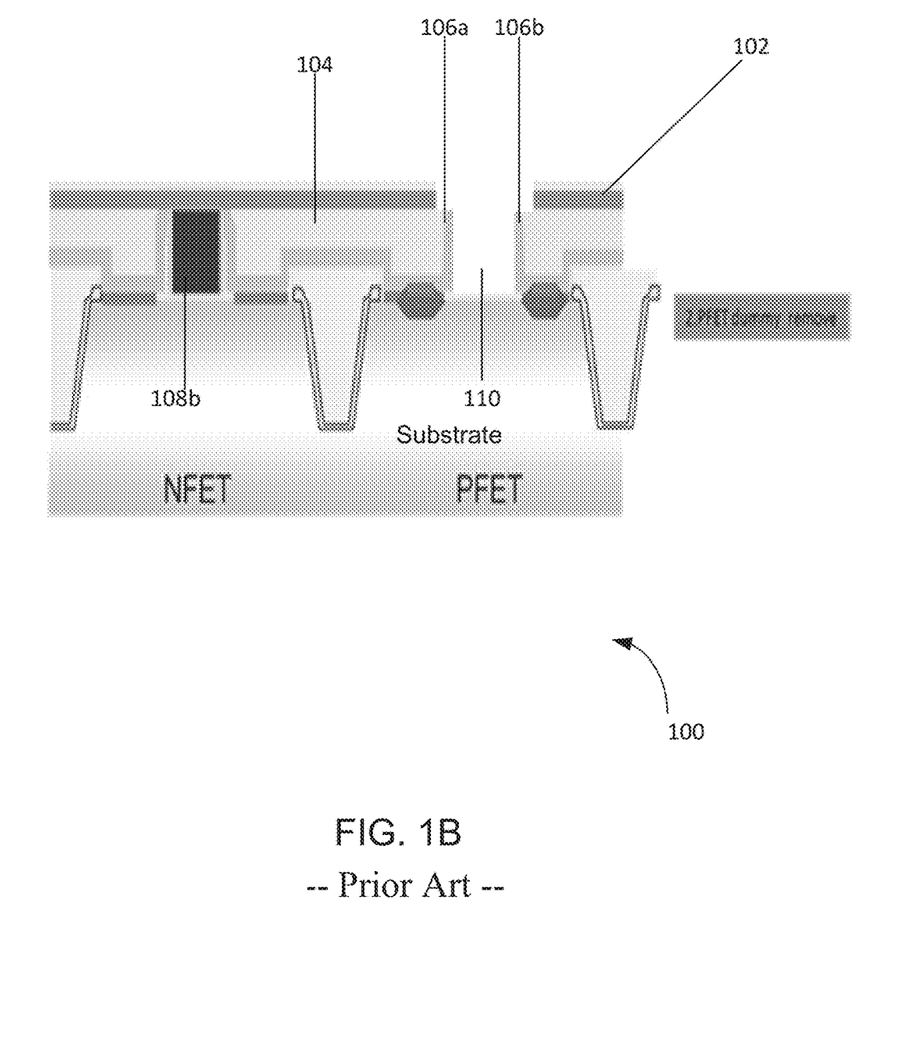
Figure 1C:
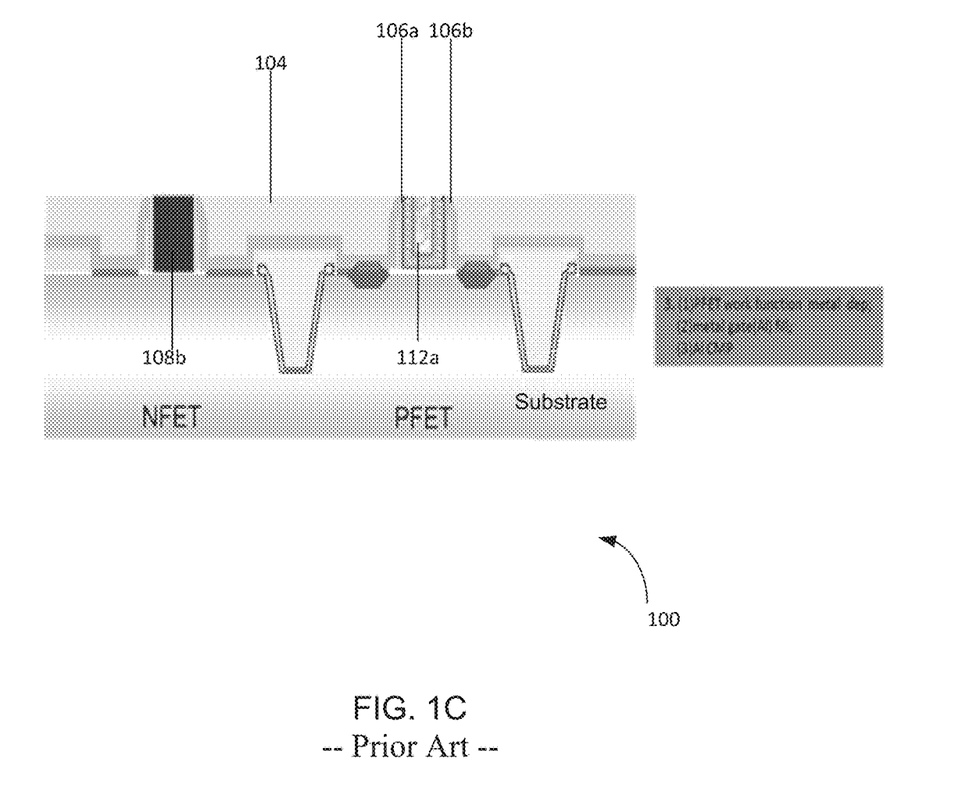
Figure 1D:
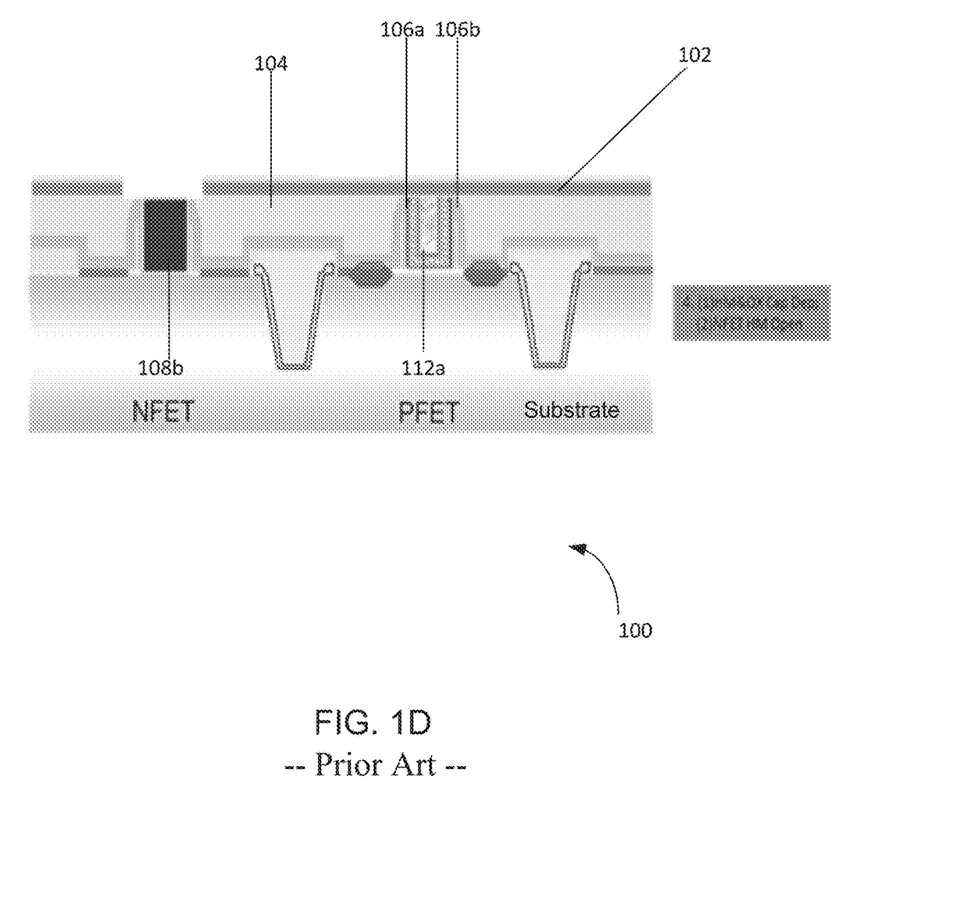
Figure 1E:
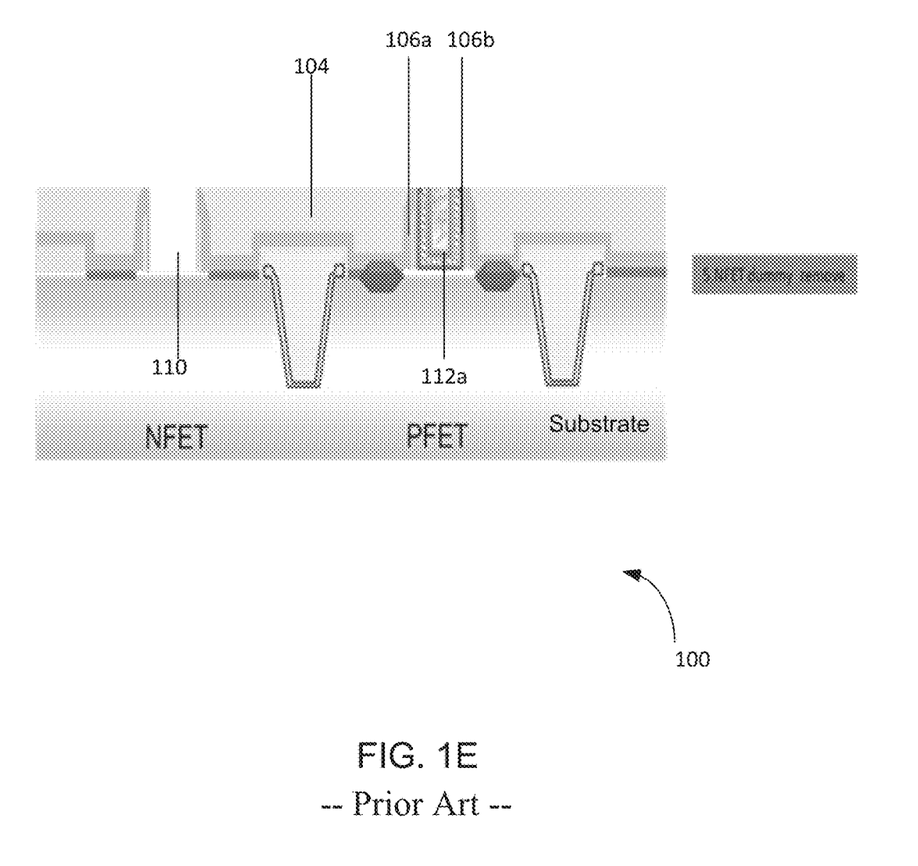
Figure 1F:
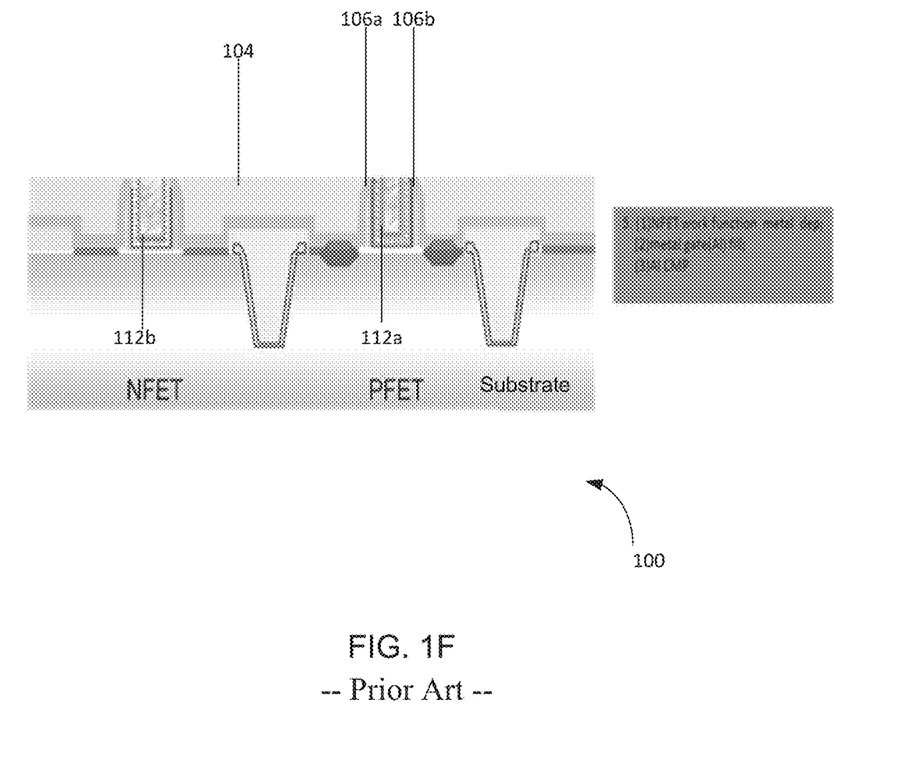

FIG. 1B illustrates a patterning process can be performed such that the dummy gate 108a at PFET can be removed to form a cavity 110. FIG. 1C illustrates PFET work function metal gate materials (e.g., aluminum) can be deposited into the cavity 110 to form a PFET substitute metal gate 112a. FIG. 1D illustrates an aluminum CMP process can then be used to polish the top surface of the substitute metal gate 112a to ensure the height of the metal gate 112a. The ILD0 104 is typically used to reduce the excessive damage during this CMP process to ensure the accuracy of the height of the substituted metal gate 112a deposited. Further, the ILD0 104 may be also used as a stress relief layer for subsequently formed vias and metal interconnections to protect the semiconductor device 100. Specifically, during this CMP process, a relatively high polishing speed may be used to polish the substituted metal gate 112a and as well as ILD0 104. FIG. 1E illustrates the dummy gate 108b at NFET is removed to form a cavity 110. FIG. 1F illustrates work function metal gate materials can be deposited into the cavity 110 to form a NFET substitute metal gate 112b and another CMP process may be performed to level the substitute metal gate 112b with ILD0 104.

Since the conventional two-step CMP process as described above typically employs a polish slurry that has a polysilicon removal rate greater than the aluminum removal rate, there tends to be over-polishing on the surface of ILD0 104. Conventionally, to address such over-polishing of ILD0 104, extra ILD0 104 may be deposited. For example, if the desired thickness of ILD0 104 is 600 angstroms after the PMOS and NMOS gates are formed, and each ILD0 CMP process causes 100 angstrom loss due to the over-polishing, the initial ILD0 104 may be deposited at 800 angstrom thick to account for the ILD0 loss during the aforementioned the two-step CMP process.

However, since the initial thickness of the ILD0 is also the height of cavity 110 formed during the PMOS dummy gate removal as shown in FIG. 1B. Accordingly, thicker ILD0 means deeper cavity 110 and an increase of a ratio between the depth and width of cavity 110, since the width of the ILD0 remains relatively unchanged. This increased ratio (due to having to account for the ILD0 losses) can increase the difficulty for filling the gate materials in cavity 110.

The present disclosure addresses and solves the current problem of increased difficulty for filling the gate materials in cavity 110 due to having to account for ILD0 losses during the two-step CMP process. One aspect of the present disclosure is a method of fabricating metal gate by forming special layers in place of traditional TiN hard mask 102 over the ILD0 layer to avoid ILD0 losses due to conventional ILD0 CMP.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a metal gate the method comprising: after the ILD0 CMP, forming a first thin ashable film layer over the ILD0 layer; then forming a second thin dielectric layer over the first layer; during the aluminum CMP process for a first region (PMOS or NMOS), removing the second layer through polishing until the top surface of the first ashable film layer; and then removing first ashable film layer through an ashing method such as burning. In this way, ILD0 loss can be reduced during the first aluminum CMP step and thus can reduce initial height of ILD0 as compared to the convention method, which in turn can reduce the height of initial dummy gate filled in the cavity, and thus improve the filling process of the dummy gate as compared to the conventional method.

Figure 2A:
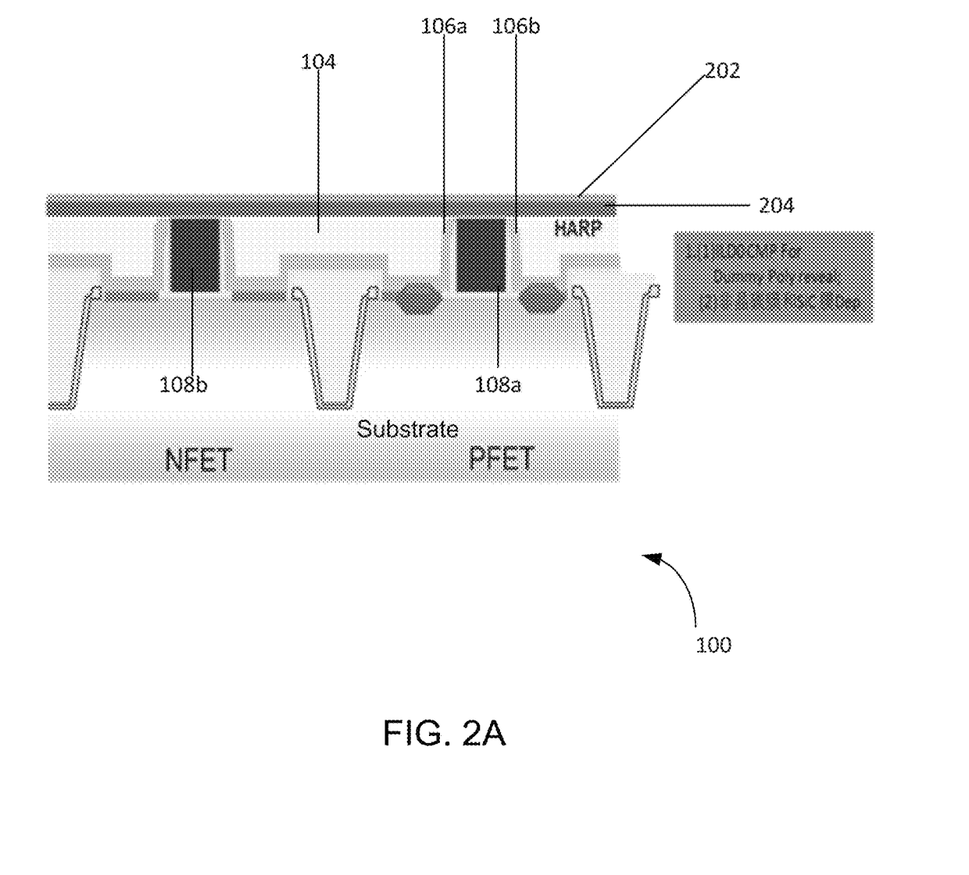
FIG. 2A illustrates, during an improved two-step CMP process for manufacturing a semiconductor device in accordance with the disclosure, after the ILD0 CMP, a first layer and a second layer can be formed over an ILD0 layer.

FIGS. 2A-E illustrate an improved process of fabricating metal gates for a semiconductor device in accordance with a disclosure. The process illustrated in these figures introduces improvements over the two-step CMP process described and illustrated above through FIG. 1A-F, and thus will be described with reference to FIG. 1A-F. It should be understood although the improved process illustrated in these figures start with a PMOS gate fabrication, this is not intended to be limiting. In some other embodiments, the improved process in accordance with the disclosure can start with a NMOS gate fabrication. FIG. 2A illustrates, during this improved process, after the ILD0 CMP, two layers can be formed over ILD0 104. As mentioned above, the first layer 204 can be a thin ashable layer such as an amorphous carbon film layer. In some embodiments, the first layer 204 can be grown using a suitable chemical vapor deposition (CVD), sputter deposition, and/or any other suitable process. The properties of amorphous carbon film of the first layer 204 vary depending on the parameters used during deposition. In some embodiments, the thickness of the first layer can be controlled between 300 angstroms to 1000 angstroms. As also mentioned above, a second layer 202 can be formed over the first layer 204 during the improved process in accordance with the disclosure. The second layer 202 can comprise silicon-carbide (SiC). In some embodiments, the thickness of second layer 202 can be controlled at 100 angstroms to 500 angstroms.

Figure 2B:
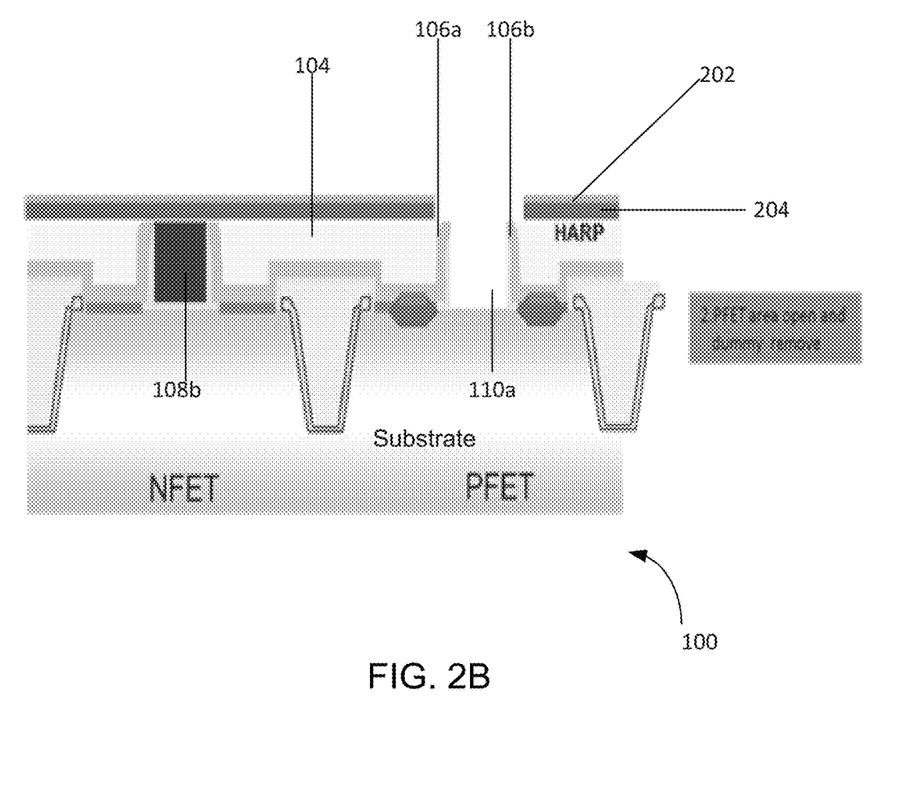
FIG. 2B illustrates a dummy gate can be removed to form a cavity during an improved two-step CMP process in accordance with the disclosure.
Figure 2C:
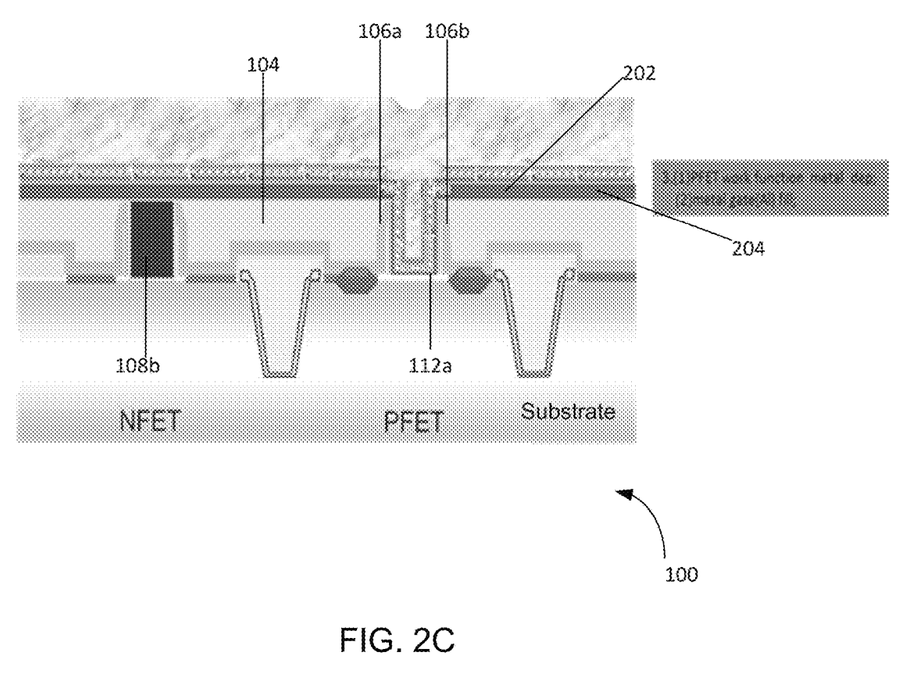
FIG. 2C illustrates a patterning process can be performed such that substituted gate materials can be filled into the cavity shown in FIG. 2 to form a metal gate during an improved two-step CMP process in accordance with the disclosure.
Figure 2D:
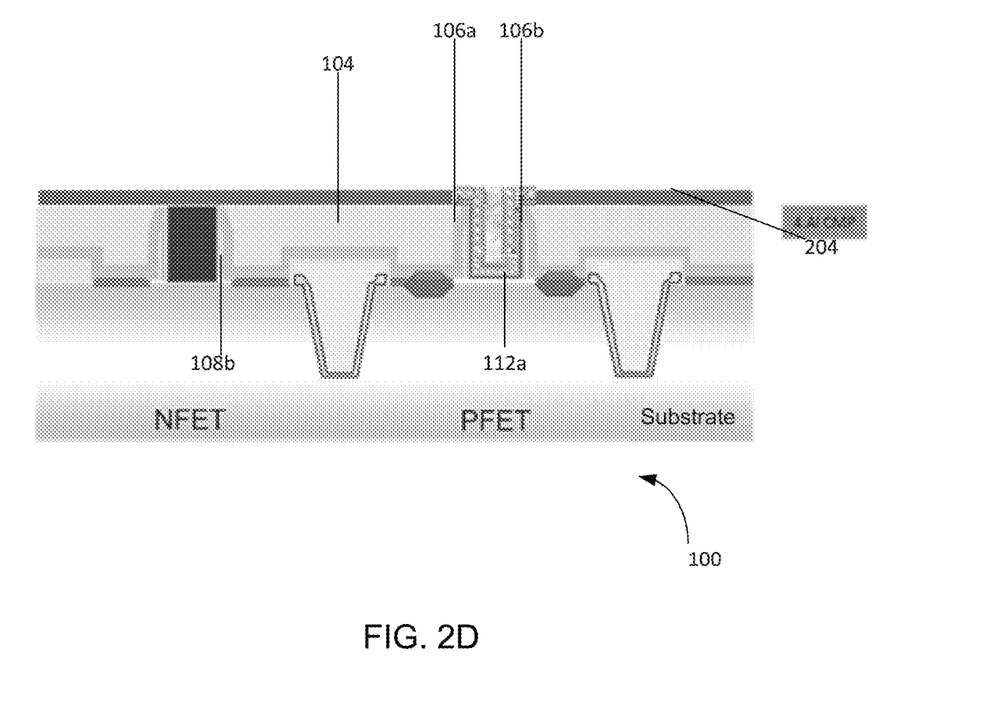
FIG. 2D illustrates an aluminum CMP can be performed to polish the top surface of the gate formed in FIG. 2C such that the polishing is controlled to stop at the top surface of the first layer shown in FIG. 2A after the second layer shown in FIG. 2A is removed.
Figure 2E:
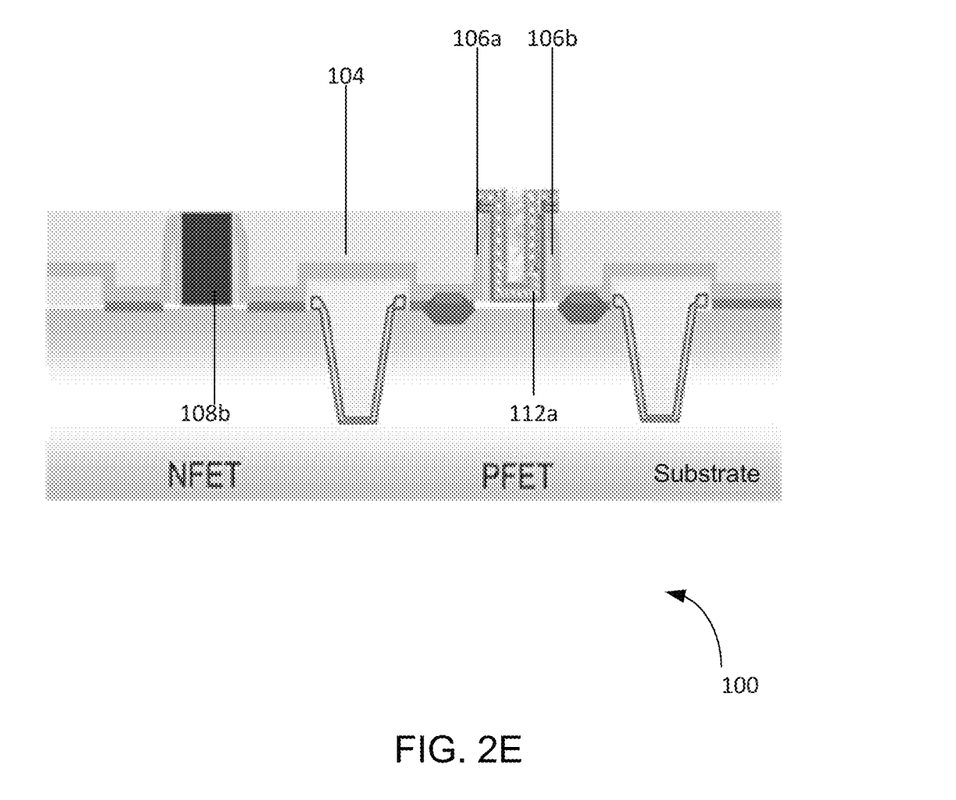
FIG. 2E illustrates after the second layer is removed as shown in FIG. 2D, the first layer shown in FIG. 2A can be removed through an ashing method.

FIG. 2B illustrates the dummy gate 108a can be removed to form a cavity 110a. In some embodiments, this removal can be done by using a Tetramethylammonium hydroxide (TMAH) process that can dissolve polycrystalline silico. In some embodiments, the opening of cavity 110a can be made wider than the width of dummy gate 108. FIG. 2C illustrates a patterning process can be performed such that substituted gate materials can be filled into cavity 110a to form gate 112a. FIG. 2D illustrates an aluminum CMP can be performed to polish the top surface of the gate 112a such that the polishing is controlled to stop at the top surface of the first layer 204 after the second layer 202 is removed. In some embodiments, the second layer 202 can be removed using a dry etching process, for example primarily through fluorinated gases such as NF3. FIG. 2E illustrates after the second layer 202 is removed, the first layer 204 can be removed through an ashing method. In some embodiments, the removal of the first layer 204 can involve using oxidizing gas. For example, O2 can be used to burn away the ashable first layer 204 that comprises amorphous carbon as described above. After the step shown in FIG. 2E, the improved process for fabricating the metal gates can continue similarly to the conventional process described above—e.g., forming a TiN hard mask, removing dummy gate at NMOS, filling substitute gate material to form a NMOS gate and performing aluminum CMP to polish the top surface of the NMOS gate. By this improved process, through the first layer 204 and the second layer 202, the ILD0 loss can be avoided during the first aluminum CMP step in the process. In this way, the initial thickness of the ILD0 104 that needs to be deposited to account for ILD0 loss during this improved two-step CMP process can be reduced as compared to the conventional process described above.

Embodiments of the present invention provide many advantages over existing techniques and methods, as explained throughout the parts of the application. It is to be appreciated that embodiments of the present invention are compatible with existing systems and processes. For example, the shaped cavities described according to the embodiments of the present invention can be manufactured using existing equipment. The shaped cavities according to embodiments of the present invention can be easily used in manufacturing various types of devices, such as CMOS, PMOS, NMOS, etc.

While the above is a full description of the specific embodiments, various modifications, alternative constructions and equivalents may be used. In addition to what is described above, there are other embodiments as well. Therefore, the above description and illustrations should not be taken as limiting the scope of the present invention which is defined by the appended claims.

What is claimed is:

1. A method for fabricating metal gates for a semiconductor device, the method comprising:
    providing a substrate; and
    providing a first metal gate type transistor region and a second metal gate type transistor region on the substrate, wherein each of the first metal gate type transistor region and second metal gate type transistor region comprise a dummy gate;
    providing a zero order interlayer dielectric layer (ILD0 layer) around the first metal gate type transistor region and the second metal gate type transistor region;
    forming an ashable first layer over the ILD0 layer;
    forming a second layer over the first layer, the second layer comprising silicon-carbide (SiC);
    performing a patterning process to remove the dummy gate in the first metal gate type transistor region and to form a first metal gate in the first metal gate type transistor region, the first metal gate being of the first metal gate type;
    performing a first chemical mechanical polishing (CMP) process to polish the first metal gate in the first metal gate type transistor region, wherein the first CMP process comprises removing the second layer but not the first layer;
    removing the first layer through an ashing method;
    forming a hard mask layer over the ILD0 layer after the first layer is removed;
    performing a patterning process to remove the dummy gate in the second metal gate type transistor region and to form a second metal gate in the second metal gate type transistor region, the second metal gate being of the second metal gate type; and
    performing a chemical mechanical polishing (CMP) process to polish the second metal gate in the second metal gate type transistor region, wherein the CMP process comprises removing the hard mask layer.

2. The method of claim 1, wherein the thickness of the first layer is between 300 angstroms to 1000 angstroms.

3. The method of claim 1, wherein the thickness of the second layer is between 100 angstroms to 500 angstroms.

4. The method of claim 1, wherein the first layer is removed by using a oxidizing gas.

5. The method of claim 1, wherein the first layer comprises amorphous carbon.

6. The method of claim 1, wherein the first metal gate type is PMOS, and the second metal gate type is NMOS.

7. The method of claim 1, wherein the first metal gate type is NMOS, and the second metal gate type is PMOS.

8. The method of claim 1, wherein the hard mask layer comprises titanium nitride (TiN).

* * * * *